United States Patent
McGeoch

(10) Patent No.: US 6,567,499 B2
(45) Date of Patent: May 20, 2003

(54) STAR PINCH X-RAY AND EXTREME ULTRAVIOLET PHOTON SOURCE

(75) Inventor: Malcolm W. McGeoch, Brookline, MA (US)

(73) Assignee: Plex LLC, Brookline, MA (US)

( * ) Notice: Subject to any disclaimer, the term of this patent is extended or adjusted under 35 U.S.C. 154(b) by 143 days.

(21) Appl. No.: 09/876,469

(22) Filed: Jun. 7, 2001

(65) Prior Publication Data
US 2002/0186814 A1 Dec. 12, 2002

(51) Int. Cl.[7] ................................................. G21K 4/00
(52) U.S. Cl. ....................................... 378/119; 250/251
(58) Field of Search .......................... 378/119; 250/251; 315/111.81, 111.91

(56) References Cited

U.S. PATENT DOCUMENTS

| | | |
|---|---|---|
| 3,258,402 A | 6/1966 | Farnsworth |
| 3,386,883 A | 6/1968 | Farnsworth |
| 3,530,497 A | 9/1970 | Hirsch et al. |
| 4,401,618 A | 8/1983 | Salisbury |
| 4,682,033 A | 7/1987 | Martin et al. |
| 5,126,638 A | 6/1992 | Dethlefsen |
| 5,315,629 A | 5/1994 | Jewell et al. |
| 5,502,356 A | 3/1996 | McGeoch |
| 5,504,795 A | 4/1996 | McGeoch |
| 5,577,092 A | 11/1996 | Kubiak et al. |
| 6,075,838 A | 6/2000 | McGeoch |
| 6,188,746 B1 | 2/2001 | Miley et al. |
| 6,414,438 B1 * | 7/2002 | Borisov et al. .......... 315/111.31 |
| 6,452,194 B2 * | 9/2002 | Bijkerk et al. ........... 250/492.2 |

FOREIGN PATENT DOCUMENTS

WO WO95/30235 9/1995

OTHER PUBLICATIONS

Malcolm W. McGeoch, "Radio Frequency Pre-ionized Xenon Z-Pinch Source for Extreme Ultraviolet Lithography", Applied Optics, 1998, pp. 1651–1658.

B.I. Kikiani et al, "Resonance Charge Exchange of Inert-Gas Ions in the Energy Range 200–4000eV", Amer. Inst. of Physics, Sov. Phys. Tech. Phys., vol. 20, No. 3, 1975, pp. 364–367.

K.K. Jain et al, "Repetitive High Current Density Pseudospark-Produced Ion Beams", Appl. Phys. Lett., vol. 62, No. 13, Mar. 29, 1993, pp. 1466–1468.

J. Christiansen et al, "Production of High Current Particle Beams by Low Pressure Spark Discharge", Zeitschrift fur Physik A, 290, pp. 35–41, 1979.

* cited by examiner

Primary Examiner—Drew A. Dunn
Assistant Examiner—Irakli Kiknadze
(74) Attorney, Agent, or Firm—Wolf, Greenfield & Sacks, P.C.

(57) ABSTRACT

A source of photons includes a discharge chamber, first and second groups of ion beam sources in the discharge chamber and a neutralizing mechanism. Each of the ion beam sources electrostatically accelerates a beam of ions of a working gas toward a plasma discharge region. The first group of ion beam sources acts as a cathode and the second group of ion beam sources acts as an anode for delivering a heating current to the plasma discharge region. The neutralizing mechanism at least partially neutralizes the ion beams before they enter the plasma discharge region. The neutralized beams and the heating current form a hot plasma that radiates photons. The photons may be in the soft x-ray or extreme ultraviolet wavelength range and, in one embodiment, have wavelengths in a range of about 10–15 nanometers.

61 Claims, 6 Drawing Sheets

STAR PINCH X-RAY AND EXTREME ULTRAVIOLET PHOTON SOURCE

FIELD OF THE INVENTION

This invention relates to plasma sources and, more particularly, to sources of soft X-ray or extreme ultraviolet photons, wherein high power production of photons is achieved by electrostatic acceleration of ions toward a plasma discharge region, neutralization of the ions to avoid space charge repulsion as the discharge region is approached and the application of a heating current through the central plasma in order to raise its temperature and density.

BACKGROUND OF THE INVENTION

Soft X-ray and extreme ultraviolet photons can be generated in a hot plasma. The wavelength of the photons is determined by the mixture of ionization states present, with generally shorter wavelength photons being produced by the radiation of higher ionization states within the plasma. An example relevant to lithography is the xenon plasma that contains states $Xe^{10+}$, $Xe^{11+}$ and $Xe^{12+}$ and radiates strongly in the 10–15 nanometer (nm) band of the spectrum. Within this band, the 13.5 nanometer wavelength is considered to be the optimum for lithography because it can be reflected with up to 70% efficiency by molybdenum-silicon multilayer mirrors in a combination that re-images the pattern of a semiconductor circuit from a mask onto a silicon wafer.

Several approaches to the generation of these energetic photons have been researched in recent years. The plasma has been heated by laser pulses in the so-called laser-produced-plasma (LPP) method. Also, the plasma has been heated directly by the passage of a pulsed electric current in a variety of discharge-produced plasma (DPP) photon sources. These include the capillary discharge, the dense plasma focus and the Z-pinch. It is believed that a viable 13.5 nm source for commercial, high throughput lithography will be required to emit approximately 100 watts of photon power into 2 steradians in a 2% fractional band at 13.5 nm, from a roughly spherical source of diameter less than 1.5 millimeters. In xenon, which is the most efficient 13.5 nm radiator (of room temperature gaseous elements), the 2% fractional band is produced at an electrical efficiency of approximately 0.5% into $2\pi$ steradians in DPP sources and up to 1% into $2\pi$ steradians in LPP sources relative to laser power absorbed. For the lithography source, a plasma power of 30–60 kilowatts (kW) is therefore required. Other requirements are for precise plasma positioning, to provide uniform illumination, and a repetition frequency greater than 6 kHz.

In the prior art, the plasma has been positioned, in the case of a laser produced plasma, by the intersection of a stabilized beam of liquid xenon with a focused laser beam. The size and positional stability of the resulting plasma are compatible with the application, but with laser efficiencies of only 4% for the pulsed lasers of interest, an electrical input power of 750 kW to 1.5 megawatts is likely to be needed in order to generate 100 watts of 13.5 nm photons, making the economics of the LPP source very unfavorable.

By supplying electrical energy directly to the plasma, the DPP source can, in principle, have a power input not much greater than the 30–60 kW plasma power. However, in prior art discharges, the plasma has, with the exception of the dense plasma focus, been too large in at least one dimension, and the dense plasma focus itself depends on a closely positioned electrode, only a few millimeters distant from the plasma, to create a small, positionally stable plasma focus. There are limits to the plasma power that can be generated in such close proximity to a solid electrode, presenting a difficult scaling challenge for the dense plasma focus source.

Pending application Ser. No. 09/815,633 filed Mar. 23, 2001 discloses a new photon source, referred to herein as the astron source, wherein energy and material are fed into a plasma at a central location via numerous energetic neutral beams. In this source, a relatively large separation has been achieved between the plasma and the nearest solid surface. The astron source also has a distributed electrode which exhibits low current density and anticipated longer life. Although this approach has enabled the generation of a hot plasma that emits extreme ultraviolet photons and is capable in principle of being scaled to 30–60 kW plasma power, it depends on a high acceleration efficiency for the neutral beam particles. To date, only 20% efficiency has been measured, and improvements in acceleration efficiency are required in order to give this photon source a good electrical efficiency.

Accordingly, there is a need for improved methods and apparatus for generating soft X-ray or extreme ultraviolet photons.

SUMMARY OF THE INVENTION

According to a first aspect of the invention, a source of photons comprises a discharge chamber, first and second groups of ion beam sources in the discharge chamber, and a neutralizing mechanism. Each of the ion beam sources electrostatically accelerates a beam of ions of a working gas toward a plasma discharge region. The first group of ion beam sources acts as a cathode, and the second group of ion beam sources acts as an anode for delivering a heating current to the plasma discharge region. The neutralizing mechanism at least partially neutralizes the ion beams before they enter the plasma discharge region. The neutralized beams and the heating current form a hot plasma in the discharge region that radiates photons.

The first and second groups of ion beam sources may comprise concentric electrode shells having sets of apertures aligned along axes which pass through the plasma discharge region. An inner electrode shell is divided into two half shells. The inner electrode half shells receive a voltage pulse that causes the heating current to be delivered to the plasma discharge region through channels formed by the ion beams. Electrical energy is delivered efficiently to the central plasma, causing heating and radiation from the ionic species of interest.

In one embodiment, the source includes a transformer having a secondary with one terminal coupled to the first group of ion beam sources and a second terminal coupled to the second group of ion beam sources. The primary of the transformer is coupled to a pulsed voltage source.

According to another aspect of the invention, a system is provided for generating photons. The system comprises a housing defining a discharge chamber, first and second groups of ion beam sources in the discharge chamber, a first voltage source for applying an accelerating voltage to the first and second groups of ion beam sources, a second voltage source for supplying a heating current through a plasma discharge region between the first and second groups of ion beam sources, a gas source for supplying a working gas to the discharge chamber, a neutralizing mechanism, and a vacuum system for controlling the pressure of the working gas in the discharge chamber. The ion beam sources each electrostatically accelerate a beam of ions of a working gas toward the plasma discharge region. The first group of ion beam sources acts as a cathode and the second group of ion beam sources acts as an anode for supplying the heating current through the plasma discharge region. The neutralizing mechanism at least partially neutralizes the ion beams before they enter the plasma discharge region, wherein the neutralized beams enter the plasma discharge region and form a hot plasma that radiates photons. The heating current heats and compresses the plasma, raising its temperature and density.

According to a further aspect of the invention, a method is provided for generating photons. The method comprises the steps of electrostatically accelerating a plurality of beams of ions of a working gas toward a plasma discharge region, at least partially neutralizing the ions beams before they enter the plasma discharge region and supplying a heating current through the plasma discharge region, wherein the neutralized beams and the heating current form a hot plasma that radiates photons.

According to a further aspect of the invention, a source of photons comprises a discharge chamber, a plurality of ion beam sources in the discharge chamber, a neutralizing mechanism and an external electrode. The ion beam sources each electrostatically accelerate a beam of ions of a working gas toward a plasma discharge region. The neutralizing mechanism at least partially neutralizes the ion beams before they enter the plasma discharge region. The external electrode is spaced from the plasma discharge region and delivers a heating current to the plasma discharge region, wherein the neutralized beams and the heating current form a hot plasma that radiates photons.

BRIEF DESCRIPTION OF THE DRAWINGS

For a better understanding of the present invention, reference is made to the accompanying drawings, which are incorporated herein by reference and in which.

DETAILED DESCRIPTION

Figure 1A:
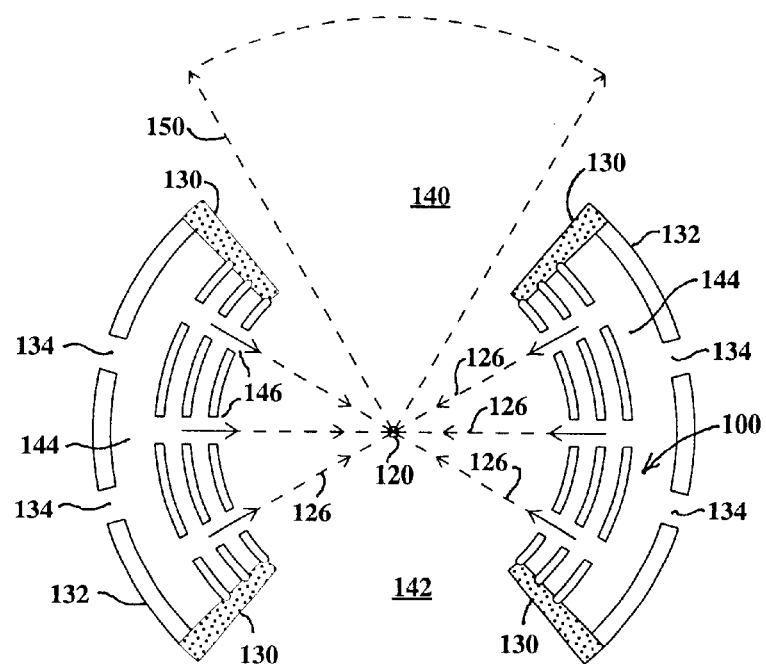
FIG. 1A is a cross-sectional side view of an embodiment of an extreme ultraviolet source based on the acceleration of multiple ion beams to a central plasma discharge region.

A photon source in accordance with a feature of the invention operates in two stages to produce X-ray or extreme ultraviolet radiation. In a first stage, a central plasma is formed using multiple ion beams directed at a central plasma discharge region as described below. In a second stage, a heating current pulse is passed through the central plasma in order to heat and compress the plasma, raising its temperature and density.

The astron source is a source of photons comprising a discharge chamber, a plurality of ion beam sources in the discharge chamber, each electrostatically accelerating a beam of ions of a working gas toward a plasma discharge region, and a neutralizing mechanism for at least partially neutralizing the ion beams before they enter the plasma discharge region. The neutralized beams enter the plasma discharge region and form a hot plasma that radiates photons.

The astron principle that operates in the first stage of the photon source described above is illustrated in FIGS. 1A and 1B. The embodiment of the source shown in FIGS. 1A and 1B has a two gap ion acceleration structure 100. Acceleration structure 100 includes concentric spherical electrode shells 112, 113 and 114. The electrode shells 112, 113 and 114 have a plurality of sets of holes aligned along axes which pass through a central plasma discharge region 120. Thus, for example, holes 122, 123 and 124 in electrode shells 112, 113 and 114, respectively, are aligned along an axis 126 that passes through plasma discharge region 120. Each set of holes, such as holes 122, 123 and 124, defines an acceleration column 128. The spaces between electrode shells 112, 113 and 114 constitute acceleration gaps for electrostatic acceleration of ion beams. Thus, each acceleration column has two gaps in the embodiment of FIGS. 1A and 1B. The embodiment of FIGS. 1A and 1B includes 36 acceleration columns 128, arrayed in three sets of 12. Thus, the acceleration structure directs 36 ion beams toward plasma discharge region 120. However, different numbers of ion beams may be utilized within the scope of the invention.

The electrode shells 112, 113 and 114 may be supported by insulating spacers 130. A plenum 132 having ports 134 encloses acceleration structure 100.

Figure 1B:
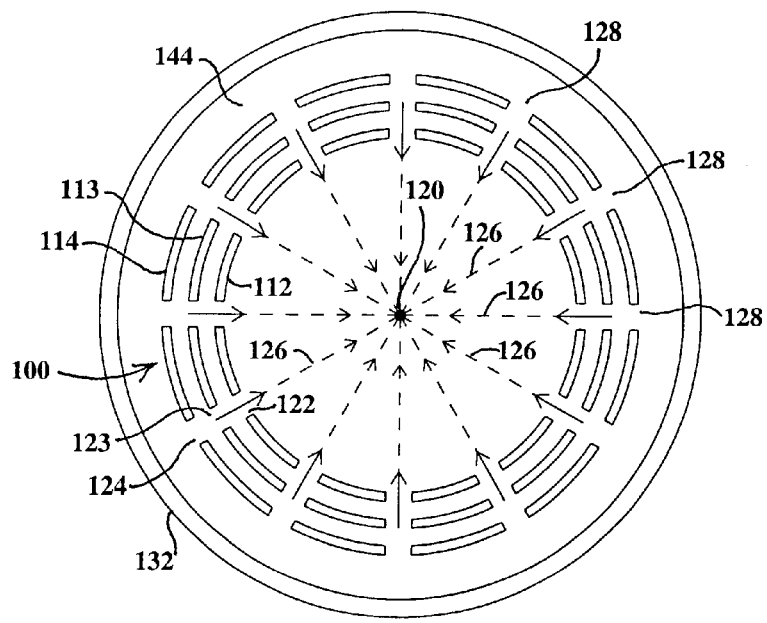
FIG. 1B is a cross-sectional top view of the extreme ultraviolet source shown in FIG. 1A.

A working gas is introduced, either in a pulsed mode or continuously, through ports 134 into a space 144 behind the outermost electrode shell 114. Some of the working gas flows down the acceleration columns 128. When the appropriate gas density is present in the acceleration columns, a pulsed voltage may be applied between electrode shells 112 and 114, with the polarity of electrode shell 114 being positive with respect to electrode shell 112. In the configuration of FIGS. 1A and 1B, provided the appropriate gas density is present and provided that sufficient voltage is applied, a pseudospark discharge develops simultaneously in each of the acceleration columns 128. The pseudospark discharge is characterized by the development of oppositely directed electron and ion beams that can have extremely high intensity. The ion beam exits from the negative polarity end of the acceleration column 128 at electrode shell 112 and progresses toward the central plasma discharge region 120.

By correct adjustment of the working gas density at an exit region 146 of each of acceleration columns 128, most of the ions can be neutralized by resonant charge exchange, so as to form a neutral beam that propagates without deflection to the plasma in plasma discharge region 120. Those ions that are not neutralized contribute excess positive charge to each of the ion beams, causing electrons to be attracted from the nearby surface of electrode shell 112, which is already primed as a cathode due to the breakdown into a pseudospark discharge. Thus, the neutral atoms are accompanied by a nearly charge-balanced beam plasma, including the remaining unneutralized ions and electrons. The slow ions resulting from resonant charge exchange define tracks that are favored for a conduction of a high current heating pulse in the second stage of device operation, as described below. Additional details and embodiments of the astron photon source are described in the aforementioned application Ser. No. 09/815,633, which is hereby incorporated by reference.

Figure 2A:
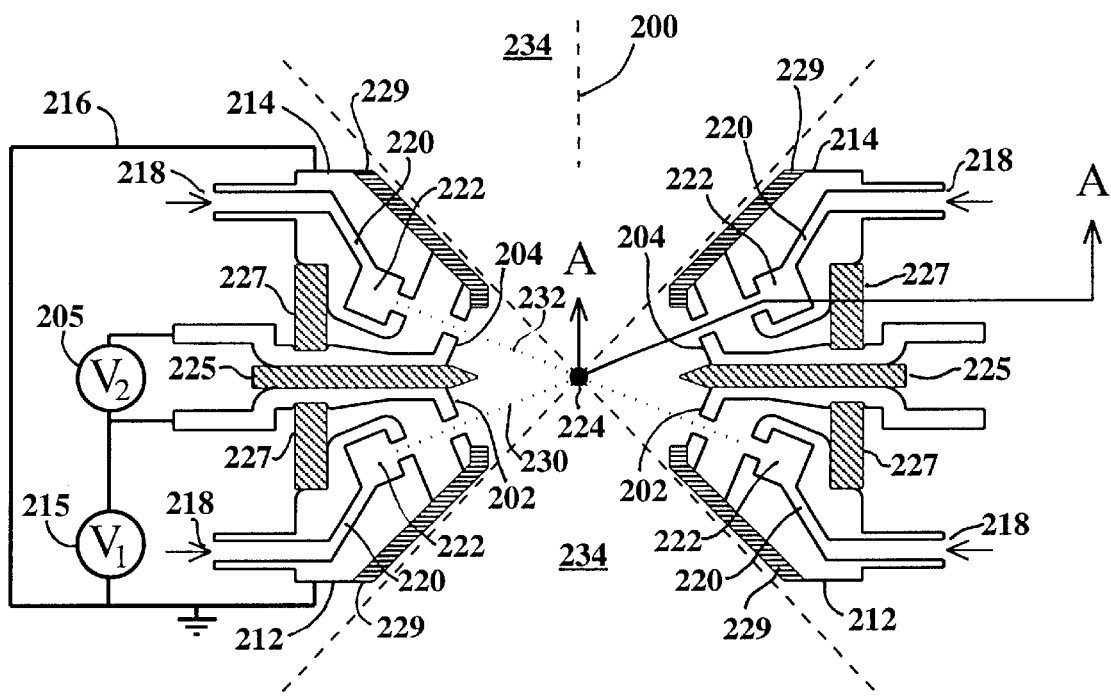
FIG. 2A is a cross-sectional side view of a first embodiment of a photon source in accordance with the invention.
Figure 2B:
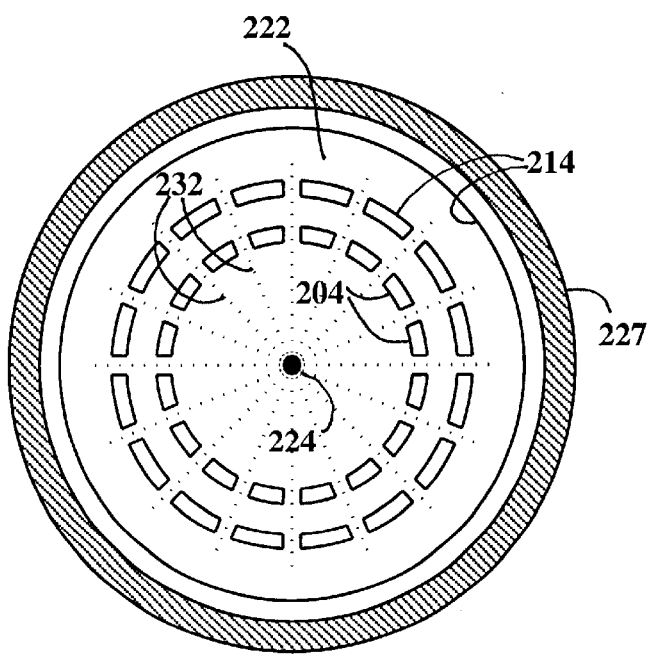
FIG. 2B is a cross-sectional top view of the photon source shown in FIG. 2A.

In the second stage of device operation, the newly formed plasma is heated and compressed, or pinched, by passage through the plasma of a pulse of electric current. A first embodiment of a photon source which incorporates both the first stage of operation, wherein beams of ions are electrostatically accelerated toward a plasma discharge region and are at least partially neutralized, and the second stage, wherein an electric current is passed through the plasma discharge region, is shown in FIGS. 2A and 2B. FIG. 2A is a simplified cross-sectional side view of the photon source, and FIG. 2B is a cross-section defined by revolution of line A—A in FIG. 2A around axis 200. In FIGS. 2A and 2B, a central cathode shell, corresponding to electrode shell 112 in FIG. 1A, is divided into two half shells 202 and 204 that are electrically connected to a pulse voltage source 205. The anode shell of the photon source is divided into two half shells 212 and 214 which are electrically connected by a conductor 216. The working gas is introduced at low pressure through ports 218 and flows through passages 220 to enter hollow anode volumes 222 within anode half shells 212 and 214. Cathode half shells 202 and 204 are electrically isolated by insulator 225. The cathode half shells are electrically isolated from the respective anode half shells by insulators 227 and 229. A pulse voltage source 215 is connected between cathode half shells 202 and 204 and anode half shells 212 and 214.

During the first phase of operation of the photon source shown in FIGS. 2A and 2B, a pulsed voltage $V_1$ from pulse voltage source 215 is applied between anode half shells 212 and 214 and cathode half shells 202 and 204. In the absence of any applied voltage $V_2$ from pulse source 205, the potential difference between cathode half shells 202 and 204 remains at zero. The combined cathode half shells are therefore pulsed negatively by voltage $V_1$ relative to the combined anode half shells, and a discharge develops as described above in connection with FIGS. 1A and 1B. Neutralized beams from this discharge pass through a plasma discharge region 224 to form a small spherical plasma. At the same time, the passage of ions and energetic neutral atoms forms ionized tracks 230 between cathode half shell 202 and plasma discharge region 224, and ionized tracks 232 between cathode half shell 204 and plasma discharge region 224. The ionized tracks 230 and 232 lie on the surfaces of two cones that have their vertices located at plasma discharge region 224 and provide conducting paths between cathode half shells 202 and 204.

During the second phase of operation, a pulsed voltage $V_2$ from pulse voltage source 205 is applied between cathode half shells 202 and 204. The circuit is completed by conduction through the conical configuration of ionized tracks connecting cathode half shells 202 and 204. The current flows through the plasma in plasma discharge region 224, heating and compressing it via the magnetic pinch effect. The plasma temperature and density rise to the point where the desired X-ray or extreme ultraviolet radiation is emitted copiously. The radiation escapes the photon source in conical beams 234 that are relayed to the point of use by collecting optical surfaces (not shown in FIGS. 2A and 2B).

The working gas pressure in the central part of the acceleration structure is preferably maintained in a range of about 1.0 to 100 millitorr. As noted above, one suitable working gas is xenon. Other suitable working gases include, but are not limited to, hydrogen, lithium, helium, nitrogen, oxygen, neon, argon and krypton.

The ion beams may be pulsed or continuous, and the ion acceleration voltage $V_1$ may be from 2 kV to 20 kV, but is not limited to this range. Voltage $V_1$ may have a typical pulse duration of 100 nanoseconds to 10 microseconds, but may also be applied continuously. The heating voltage $V_2$ is applied typically within 100 nanoseconds to 10 microseconds of the initial application of voltage $V_1$. The amplitude of voltage $V_2$ is typically in the range of 100 volts to 10 kV, and the width of this pulse typically ranges from 10 nanoseconds to 1 microsecond.

Figure 3:
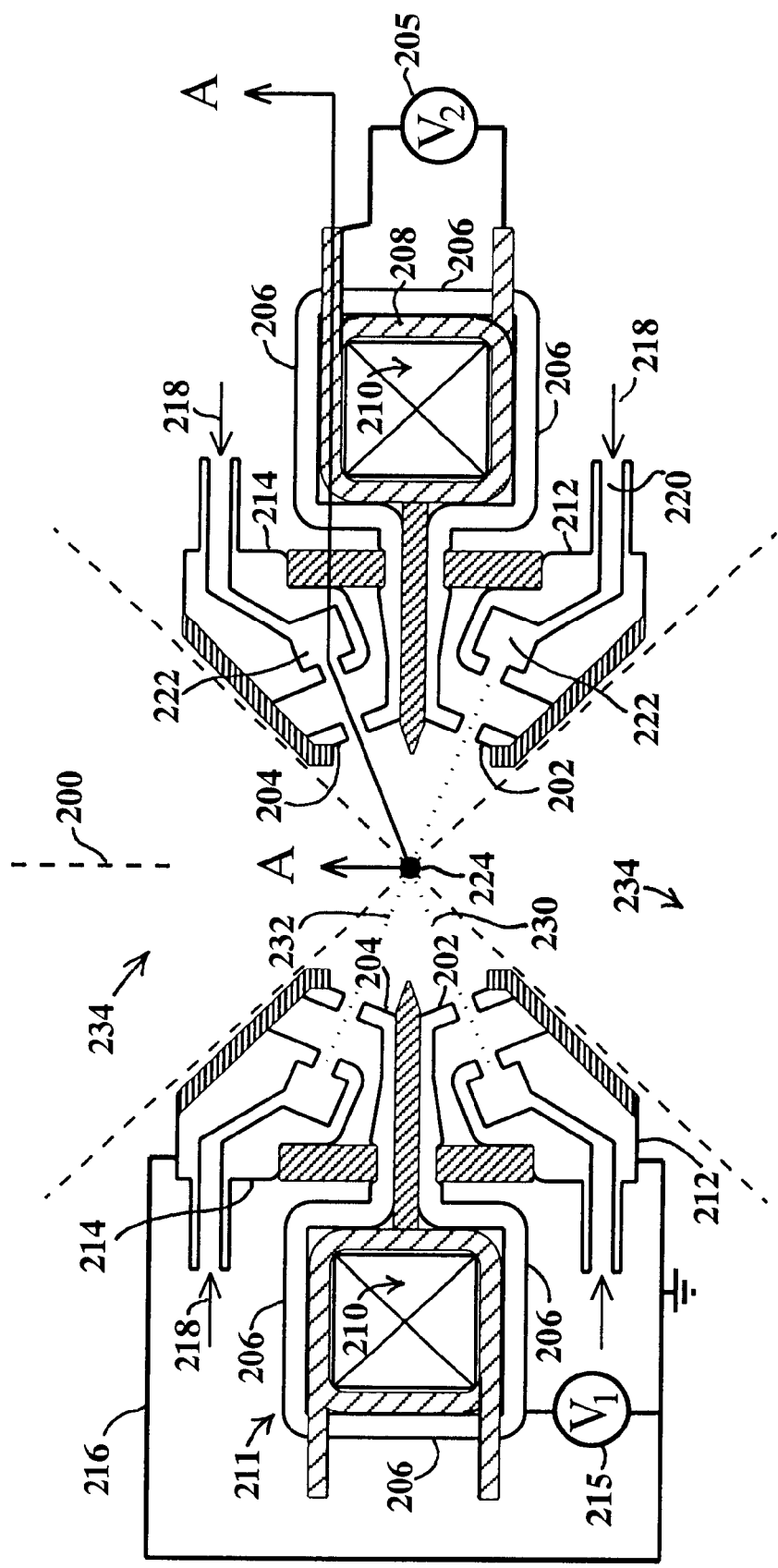
FIG. 3 is a cross-sectional side view of a second embodiment of a photon source in accordance with the invention.
Figure 4:
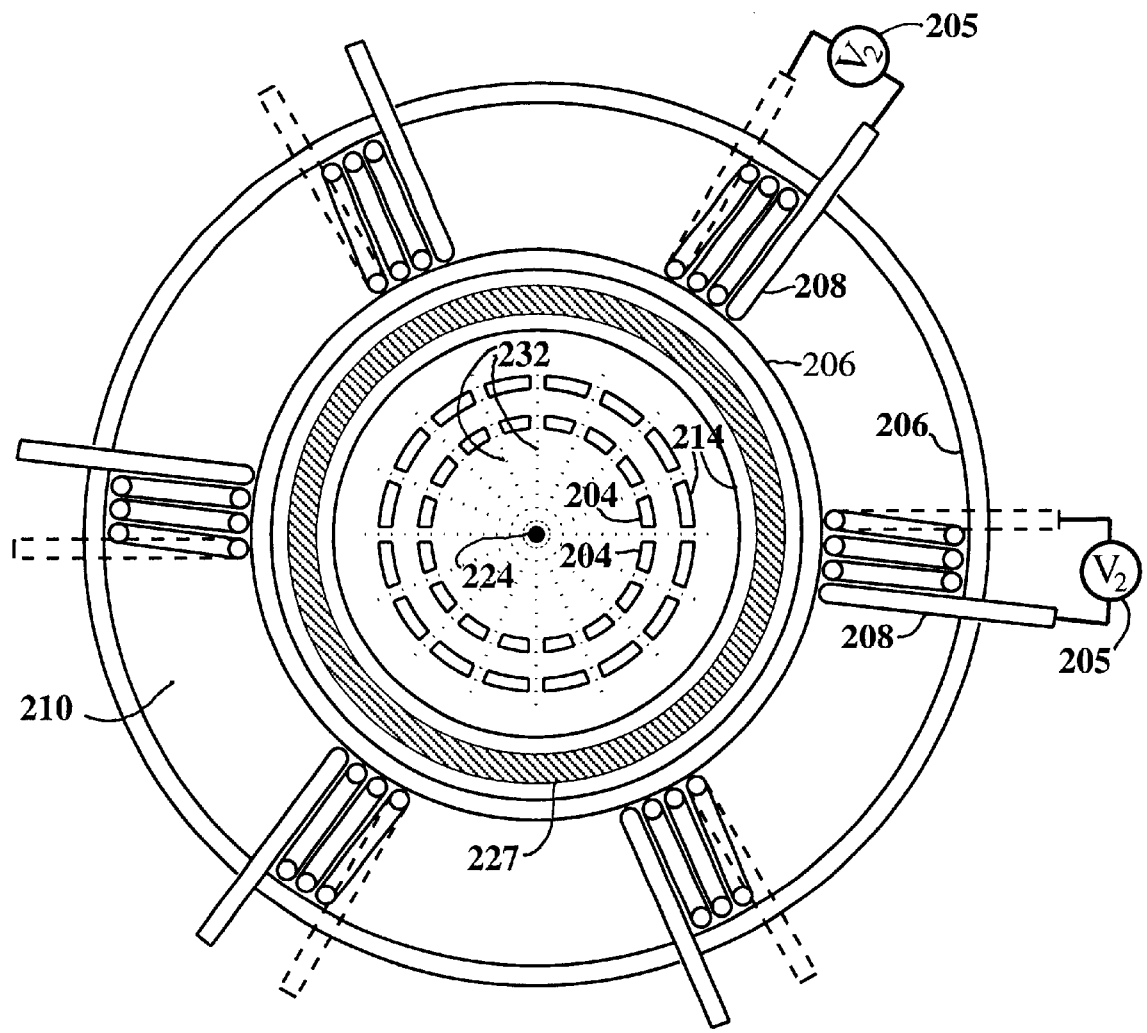
FIG. 4 is a cross-sectional top view of the photon source shown in FIG. 3.

A second embodiment of a photon source in accordance with the invention is shown in FIGS. 3 and 4. FIG. 3 is a simplified cross-sectional side view of the photon source, and FIG. 4 is a cross-section defined by revolution of line A—A in FIG. 3 around axis 200. Like elements in FIGS. 2A, 2B, 3 and 4 have the same reference numerals. The embodiment of FIGS. 3 and 4 differs from the embodiment of FIGS. 2A and 2B by the addition of a transformer 211 for coupling pulsed electrical current from pulse voltage source 205 to cathode half shells 202 and 204. Transformer 211 includes multiple primary windings 208, a toroidal core 210, which may be of non-magnetic or magnetic material, and an armature or secondary 206, also having a toroidal configuration. Primary windings 208 are connected to pulse voltage source 205, and secondary 206, which may have a single turn, is connected between cathode half shells 202 and 204.

During the first phase of operation, a pulsed voltage $V_1$ is applied between the anode half shells 212 and 214 and secondary winding 206 that is connected to cathode half shells 202 and 204. In the absence of any applied voltage $V_2$ from pulse voltage source 205 to primary windings 208, the electric potential between the cathode half shells 202 and 204 remains at zero. The combined cathode half shells are therefore pulsed negatively by voltage $V_1$ relative to the combined anode half shells 212 and 214, and a discharge develops as described above. The neutralized beams of this discharge pass through plasma discharge region 224 to form a small spherical plasma. At the same time, the passage of ions and energetic neutral atoms forms ionized tracks 230 and 232 as described above.

During the second phase of operation, a pulsed voltage $V_2$ is applied simultaneously and in parallel across all the primary windings 208, with the result that a voltage is induced between cathode half shells 202 and 204 that are connected to opposite ends of transformer secondary 206. The transformer secondary circuit is completed by a conduction through the ionized tracks 230 and 232 connecting cathode half shells 202 and 204. The secondary current flows through the plasma in plasma discharge region 224, heating and compressing it via the magnetic pinch effect. As described above, the plasma temperature and density rise to the point where the desired X-ray or extreme ultraviolet radiation is emitted.

Figure 5:
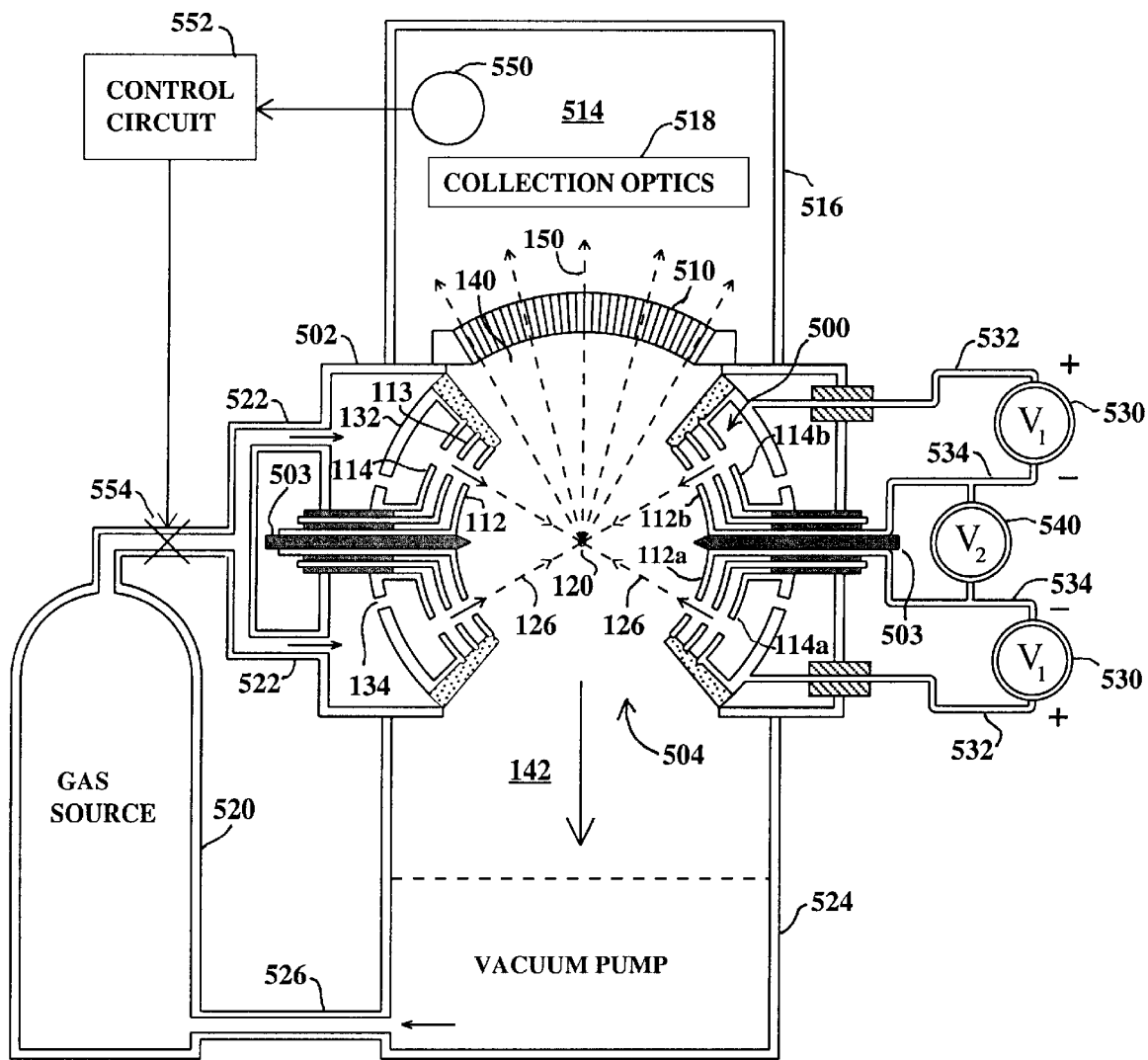
FIG. 5 is a schematic representation of an embodiment of a system for generating photons in accordance with the invention.

An embodiment of a system for generating photons in accordance with the invention is shown schematically in FIG. 5. An acceleration structure 500 may correspond to the acceleration structure shown in FIGS. 2A and 2B, the acceleration structure shown in FIGS. 3 and 4, or in any other acceleration structure within the scope of the present invention. In the system of FIG. 5, acceleration structure 500 is a modification of acceleration structure 100 shown in FIGS. 1A and 1B and described above. Like elements in FIGS. 1A, 1B and 5 have the same reference numerals.

Acceleration structure 500 includes concentric spherical electrode shells 112, 113 and 114, each of which is divided by an insulator 503 into electrode half shells. A pulse voltage source 540 is connected between inner electrode half shells 112a and 112b. A pulse voltage source 530 is connected between outer electrode half shells 114a and 114b and inner electrode half shells 112a and 112b.

Acceleration structure 500 is enclosed within a housing 502 that defines a discharge chamber 504. A top aperture 140 of acceleration structure 500 is coupled through a screen 510 to a collection region 514 that is defined by an enclosure 516. Enclosure 516 contains collection optics 518 for relaying a photon beam 150 to a remote point of use. Screen 510 allows propagation of photons from discharge chamber 504 to collection region 514 but impedes flow of gas from discharge chamber 504 to collection region 514. A gas source 520 coupled to housing 502 supplies a working gas through inlets 522 and ports 134 in plenum 132 to acceleration structure 500. A bottom aperture 142 of acceleration structure 500 is coupled to a vacuum pump 524. An outlet 526 of vacuum pump 524 is connected to gas source 520 to form a gas recirculation system. The gas source 520 and the vacuum pump 524 are connected to housing 502 in a closed loop configuration that permits recirculation of the working gas through discharge chamber 504. Gas source 520 may include elements for removing impurities and particulates from the working gas. The system may include a detector 550 located in collection region 514, a control circuit 552 and a flow controller 554 for a feedback control of the rate of flow of the working gas into the discharge chamber 504 in response to a measured spectrum of the radiated photons.

The system of FIG. 5 operates with first and second phases as described above in connection with FIGS. 2A and 2B. In particular, pulse source 530 applies a pulsed voltage between inner electrode half shells 112a and 112b and outer electrode half shells 114a and 114b, causing neutralized beams to be directed toward plasma discharge region 120. In the second stage, the plasma in discharge region 120 is heated and compressed by passage of a pulse of electric current. The neutralized beams form ionized tracks between cathode half shells 112a and 112b and plasma discharge region 120. Application of a pulse to cathode half shells 112a and 112b by pulse source 540 causes electrical current to flow along the ionized tracks through plasma discharge region 120, heating and compressing the central plasma. The plasma temperature and density rise to the point where the desired x-ray or extreme ultraviolet radiation is emitted. The radiation escapes the acceleration structure 500 as conical photon beam 150.

Figure 6A:
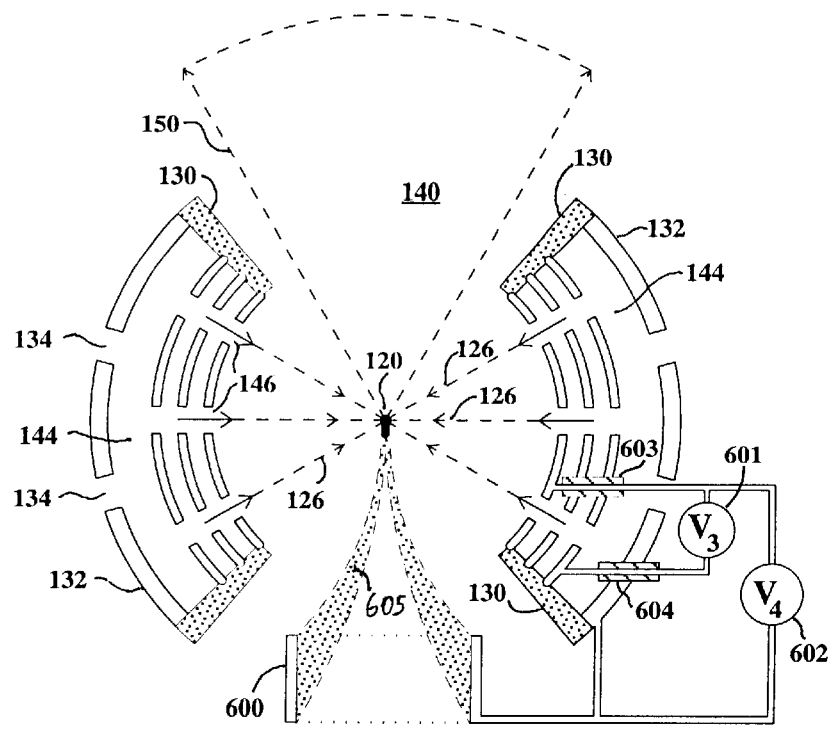
FIG. 6A is a cross-sectional side view of a third embodiment of a photon source in accordance with the invention.
Figure 6B:
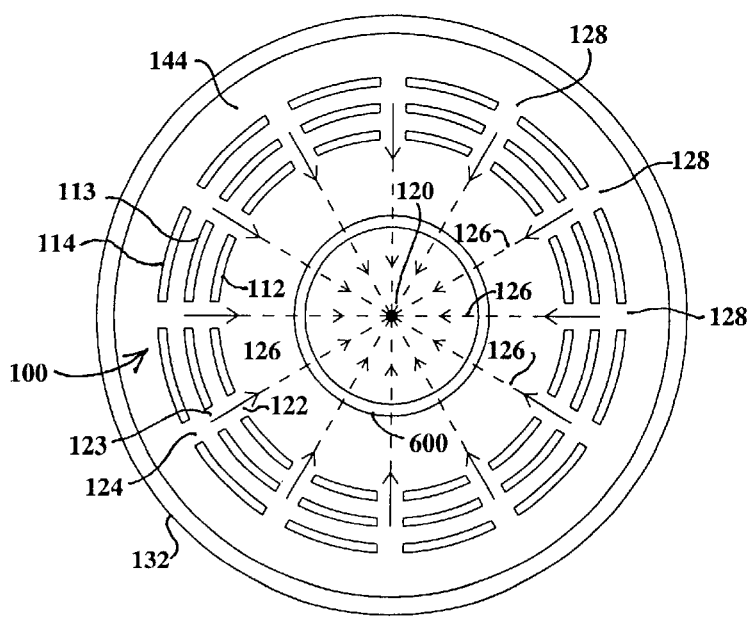
FIG. 6B is a cross-sectional top view of the photon source shown in FIG. 6A.

A third embodiment of a photon source in accordance with the invention is shown in FIGS. 6A and 6B. Like elements in FIGS. 1A, 1B, 6A and 6B have the same reference numerals. The embodiment of FIGS. 6A and 6B differs from the structure of FIGS. 1A and 1B by the addition of an external electrode 600 for supplying an electrical heating current to plasma discharge region 120. A pulse voltage source 601 is connected between inner electrode shell 112 and outer electrode shell 114. A pulse voltage source 602 is connected between inner electrode shell 112 and external electrode 600. Insulators 603 and 604 electrically isolate the connections to electrode shells 112 and 114, respectively. External electrode 600 may have a cylindrical configuration and may be positioned in the bottom aperture of the acceleration structure in spaced relationship to plasma discharge region 120.

During the first phase of operation, a pulse voltage $V_3$ from voltage source 601 is applied between electrode shells 112 and 114. A discharge develops as described above, and the neutralized beams of the discharge pass through plasma discharge region 120 to form a plasma. At the same time, the passage of ions and energetic neutral atoms forms ionized tracks as described above.

During the second phase of operation, a pulse voltage $V_4$ from voltage source 602 is applied between external electrode 600 and electrode shell 112. The circuit is completed by conduction through the ionized tracks connecting electrode shell 112 and plasma discharge region 120 and through a glow region 605 between plasma discharge region 120 and external electrode 600. The current flows through the plasma in plasma discharge region 120, heating and compressing it. The plasma temperature and density rise to the point where the desired x-ray or extreme ultraviolet radiation is emitted. The plasma tends to be elongated in the direction of external electrode 600. The working gas extends to electrode 600 at approximately the same pressure as inside electrode shell 112.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A source of photons comprising:
    a discharge chamber;
    first and second groups of ion beam sources in the discharge chamber, each electrostatically accelerating a beam of ions of a working gas toward a plasma discharge region, said first group of ion beam sources acting as a cathode and said second group of ion beam sources acting as an anode for delivering a heating current to the plasma discharge region; and
    a neutralizing mechanism for at least partially neutralizing said ion beams before they enter the plasma discharge region, wherein the neutralized beams and the heating current form a hot plasma that radiates photons.

2. A source as defined in claim 1, wherein said ion beams precede said heating current.

3. A source as defined in claim 1, wherein said heating current is pulsed and wherein said ion beams comprise pulsed ion beams that precede said pulsed heating current.

4. A source as defined in claim 1, wherein said ion beam sources comprise continuous ion beam sources and wherein said heating current is pulsed.

5. A source as defined in claim 1, wherein said first and second groups of ion beam sources are distributed around opposite halves of the plasma discharge region.

6. A source as defined in claim 5, wherein said first and second groups of ion beam sources together comprise a spherical array.

7. A source as defined in claim 1, further comprising a transformer having a primary and a secondary, wherein a first terminal of said secondary is coupled to said first group of ion beam sources and wherein a second terminal of said secondary is coupled to said second group of ion beam sources.

8. A source as defined in claim 7, wherein the secondary of said transformer has a single turn.

9. A source as defined in claim 1, wherein said first and second groups of ion beam sources comprise concentric electrode shells having sets of apertures aligned along axes which pass through the plasma discharge region, a first voltage source for applying a voltage between said electrode shells, and a gas source for supplying the working gas to the sets of apertures in said electrode shells.

10. A source as defined in claim 9, further comprising a second voltage source coupled between said first and second groups of ion beam sources for supplying said heating current.

11. A source as defined in claim 1, wherein said neutralizing mechanism comprises resonant charge exchange in each of said ion beams.

12. A source as defined in claim 1, wherein said photons are in the soft X-ray or extreme ultraviolet wavelength range.

13. A source as defined in claim 1, wherein the working gas is xenon and wherein the radiated photons have wavelengths in a range of about 10–15 nanometers.

14. A source as defined in claim 1, wherein the working gas is selected from the group consisting of hydrogen, lithium, helium, nitrogen, oxygen, neon, argon and krypton.

15. A system for generating photons, comprising:
a housing defining a discharge chamber;
first and second groups of ion beam sources in the discharge chamber, each electrostatically accelerating a beam of ions of a working gas toward a plasma discharge region, said first group of ion beam sources acting as a cathode and said second group of ion beam sources acting as an anode;
a first voltage source for applying an accelerating voltage to said first and second groups of ion beam sources;
a second voltage source for supplying a heating current through the plasma discharge region between said first and second groups of ion beam sources;
a gas source for supplying a working gas to the discharge chamber;
a neutralizing mechanism for at least partially neutralizing said ion beams before they enter the plasma discharge region, wherein the neutralized beams enter the plasma discharge region and form a hot plasma that radiates photons; and
a vacuum system for controlling the pressure of the working gas in the discharge chamber.

16. A system as defined in claim 15, wherein said first and second groups of ion beam sources comprise concentric electrode shells having sets of apertures aligned along axes which pass through the plasma discharge region, wherein at least an inner electrode shell of said concentric electrode shells is divided to form said cathode and said anode.

17. A system as defined in claim 15, wherein said ion beams precede said heating current.

18. A system as defined in claim 15, wherein said first and second voltage sources are pulsed so as to provide pulsed ion beams that precede a pulsed heating current.

19. A system as defined in claim 15, wherein said first voltage source produces continuous ion beams and wherein said second voltage source produces a pulsed heating current.

20. A system as defined in claim 15, further comprising a transformer having a primary coupled to said second voltage source and a secondary coupled between said first and second groups of ion beam sources.

21. A method for generating photons, comprising the steps of:
electrostatically accelerating a plurality of beams of ions of a working gas toward a plasma discharge region;
at least partially neutralizing said ion beams before they enter the plasma discharge region; and
supplying a heating current through the plasma discharge region, wherein the neutralized beams and the heating current form a hot plasma that radiates photons.

22. A method as defined in claim 21 wherein the step of electrostatically accelerating a plurality of beams of ions precedes the step of supplying a heating current through the plasma discharge region.

23. A method as defined in claim 21 wherein the step of supplying a heating current comprises supplying a pulsed heating current and wherein the step of electrostatically accelerating a plurality of beams of ions comprises accelerating a plurality of pulsed ion beams that precede the pulsed heating current.

24. A method as defined in claim 21 wherein the step of supplying a heating current comprises coupling the heating current to a spherical electrode array through a transformer.

25. A source of photons comprising:
a discharge chamber;
a plurality of ion beam sources in the discharge chamber, each electrostatically accelerating a beam of ions of a working gas toward a plasma discharge region;
a neutralizing mechanism for at least partially neutralizing said ion beams before they enter the plasma discharge region; and
an external electrode spaced from the plasma discharge region and biased with respect to the ion beam sources for delivering a heating current to the plasma discharge region, wherein the neutralized beams and the heating current form a hot plasma that radiates photons.

26. A source as defined in claim 25 wherein said ion beam sources comprise concentric electrode shells having sets of apertures aligned along axes which pass through the plasma discharge region, a first voltage source for applying a voltage between said electrode shells, and a gas source for supplying the working gas to the sets of apertures in said electrode shells.

27. A source as defined in claim 26 further comprising a second voltage source coupled between said ion beam sources and said external electrode for supplying said heating current.

28. A source as defined in claim 25 wherein said external electrode has a cylindrical configuration.

29. A source of photons comprising:
a housing that defines a discharge chamber;
a first group of ion beam sources directed toward a plasma discharge region in the discharge chamber, wherein a component of said first group of ion sources constitutes a first electrode;
a second electrode spaced from the plasma discharge region;
a first power supply for energizing the first group of ion beam sources to electrostatically accelerate, from the first group of ion beam sources toward the plasma discharge region, ion beams which are at least partially neutralized before they enter the plasma discharge region; and
a second power supply coupled between the first and second electrodes for delivering a heating current to the plasma discharge region, wherein the ion beams and the heating current form a hot plasma that radiates photons.

30. A source of photons as defined in claim 29, wherein the ion beam sources of said first group of ion beam sources are distributed around the plasma discharge region.

31. A source of photons as defined in claim 29, further comprising a second group of ion beam sources directed toward the plasma discharge region, wherein a component of said second group of ion beam sources constitutes said second electrode.

32. A source of photons as defined in claim 31, wherein said first and second groups of ion beam sources together comprise a spherical array of ion beam sources.

33. A source of photons as defined in claim 31, wherein the ion beam sources of said first and second groups of ion beam sources are distributed around the plasma discharge region.

34. A source of photons as defined in claim 31, wherein said first and second groups of ion beam sources comprise inner and outer electrode shells having sets of apertures aligned along axes which pass through the plasma discharge region, and wherein said first power supply is coupled between said inner and outer electrode shells.

35. A source of photons as defined in claim 34, wherein said inner shell comprises a first inner shell portion and a second inner shell portion and wherein said second power supply is coupled between said first and second inner shell portions.

36. A source of photons as defined in claim 31, wherein said first group of ion beam sources includes a first inner shell portion and said second group of ion beam sources includes a second inner shell portion, and wherein said second power supply is coupled between said first and second inner shell portions.

37. A source of photons as defined in claim 31, wherein said first group of ion sources includes a first inner shell portion and said second group of ion sources includes a second inner shell portion, said source further comprising a transformer having a primary and a secondary, wherein said primary is coupled to said second power supply, wherein a first terminal of said secondary is coupled to said first inner shell portion and wherein a second terminal of said secondary is coupled to said second inner shell portion.

38. A source of photons as defined in claim 37, wherein the secondary of said transformer has a single turn.

39. A source of photons as defined in claim 29, wherein a photon beam is emitted from the plasma discharge region in a beam direction and wherein said second electrode is spaced from the plasma discharge region in a direction opposite the beam direction.

40. A source of photons as defined in claim 39, wherein said first group of ion beam sources comprises inner and outer electrode shells having sets of apertures aligned along axes which pass through the plasma discharge region and wherein said second power supply is coupled between said inner electrode shell and said second electrode.

41. A source of photons as defined in claim 39, wherein said second electrode comprises a ring.

42. A source of photons as defined in claim 39, wherein said second electrode comprises a cathode for delivering a heating current to the plasma discharge region.

43. A source of photons as defined in claim 29, wherein the ion beams precede the heating current.

44. A source of photons as defined in claim 29, wherein the heating current is pulsed and wherein the ion beams comprise pulsed ion beams that precede the pulsed heating current.

45. A source of photons as defined in claim 29, wherein the ion beams are continuous and wherein the heating current is pulsed.

46. A source of photons as defined in claim 29, wherein the ion beams are at least partially neutralized by resonant charge exchange.

47. A source of photons as defined in claim 29, wherein the radiated photons are in the soft X-ray or extreme ultraviolet wavelength range.

48. A source of photons as defined in claim 29, wherein the ion beams comprise xenon ions and wherein the radiated photons have wavelengths in a range of about 10–15 nanometers.

49. A source of photons as defined in claim 29, wherein the ion beams comprise ions of a working gas selected from the group consisting of xenon, hydrogen, lithium, helium, nitrogen, oxygen, neon, argon and krypton.

50. A source of photons as defined in claim 29, wherein said first group of ion beam sources comprises a first hollow ring electrode and an inner shell that at least partially encloses the plasma discharge region.

51. A source of photons as defined in claim 50, wherein said first power supply is connected between said first hollow ring electrode and said inner shell.

52. A source of photons as defined in claim 50, further comprising a second group of ion sources, said second group of ion sources comprising a second hollow ring electrode and said inner shell.

53. A source of photons as defined in claim 52, wherein said first power supply has a first terminal connected to said first and second hollow ring electrodes and a second terminal connected to said inner shell.

54. A source of photons as defined in claim 50, wherein said first hollow ring electrode and said inner shell have a plurality of hole pairs which define plasma channels from the first hollow ring electrode to the plasma discharge region.

55. A source of photons as defined in claim 52, wherein said first hollow ring electrode and said inner shell have a plurality of hole pairs which define plasma channels from the first hollow ring electrode to the plasma discharge region and wherein said second hollow ring electrode and said inner shell have a plurality of hole pairs which define plasma channels from the second hollow ring electrode to the plasma discharge region.

56. A source of photons as defined in claim 29, wherein said second power supply is triggered to deliver a heating current about 0.1 to 10 microseconds after said first power supply is triggered to energize said first group of ion beam sources.

57. A source of photons as defined in claim 29, further comprising a gas source for supplying a working gas to the discharge chamber, wherein the working gas is ionized to form the ion beams.

58. A source of photons as defined in claim 29, wherein said first and second electrodes are configured such that the heating current is conducted along the ion beams to the plasma discharge region.

59. A source of photons comprising:

means for accelerating a group of ion beams toward a plasma discharge region in a discharge chamber, wherein the ion beams are at least partially neutralized before they enter the plasma discharge region; and means for supplying a heating current to the plasma discharge region, wherein the ion beams and the heating current form a hot plasma that radiates photons.

60. A method for generating photons, comprising:

accelerating a group of ion beams toward a plasma discharge region in a discharge chamber, wherein the ion beams are at least partially neutralized before they enter the plasma discharge region; and supplying a heating current to the plasma discharge region, wherein the ion beams and the heating current form a hot plasma that radiates photons.

61. A system for generating photons, comprising:

a housing defining a discharge chamber;

a first group of ion beam sources directed toward a plasma discharge region in the discharge chamber, wherein a component of said first group of ion sources constitutes a first electrode;

a second electrode spaced from the plasma discharge region;

a first power supply for energizing the first group of ion beam sources to accelerate, from the first group of ion beam sources toward the plasma discharge region, beams of ions of a working gas, wherein the ions are at least partially neutralized before they enter the plasma discharge region;

a second power supply coupled between the first and second electrodes for delivering a heating current to the plasma discharge region;

a gas source for supplying the working gas to the discharge chamber; and a vacuum system for controlling the pressure of the working gas in the discharge chamber.

* * * * *